United States Patent [19]

Leanes et al.

[11] Patent Number: 5,325,064

[45] Date of Patent: Jun. 28, 1994

[54] WIDEBAND FLAT POWER DETECTOR

[75] Inventors: James A. Leanes, San Francisco; Wang C. Wu, Mountainview, both of Calif.

[73] Assignee: Harris Corporation, Melbourne, Fla.

[21] Appl. No.: 992,310

[22] Filed: Dec. 21, 1992

[51] Int. Cl.⁵ .............................................. G01R 27/04
[52] U.S. Cl. ................................. 324/638; 333/109; 333/116
[58] Field of Search ............... 333/109, 112, 115, 116, 333/28 R; 329/354, 370; 324/95, 638, 646, 647

[56] References Cited

U.S. PATENT DOCUMENTS

| | | | |
|---|---|---|---|
| 2,562,281 | 7/1951 | Mumford | 333/115 |
| 4,641,082 | 2/1987 | Griffin et al. | 333/109 X |
| 5,235,295 | 8/1993 | Barbaste et al. | 333/28 R |

FOREIGN PATENT DOCUMENTS

| | | | |
|---|---|---|---|
| 147450 | 12/1978 | Japan | 333/115 |
| 23652 | 2/1980 | Japan | 333/116 |

*Primary Examiner*—Paul Gensler
*Attorney, Agent, or Firm*—Joel I. Rosenblatt

[57] ABSTRACT

A wideband detector having a substantially flat response is made by using the signal at the isolation port of a coupler. As the response or transfer characteristic at the isolation port is substantially linear, a matching network having the inverse opposite transfer characteristic with respect to frequency may be connected to the coupler. The addition of the matching network transfer characteristic to the transfer characteristic of the coupler in the isolation port produces a superposition. Accordingly, the matching network transfer characteristic compensates for the linear varying transfer characteristic at the coupler isolation port to produce a substantially flat output of the matching network. The detector connected to the matching network output will then produce a detector signal which is substantially flat over the frequency range of the bandspread of interest.

24 Claims, 4 Drawing Sheets

WIDEBAND FLAT POWER DETECTOR

FIELD OF THE INVENTION

This invention is in the field of detectors for detecting output power of an amplifier over a wide frequency band.

BACKGROUND OF THE PRIOR ART

Detectors useful for sensing a voltage or current level indicative of the power output level at a amplifier are well known to those skilled in the art. Additionally, in the field of microwave transmission, micro-strip directional couplers are similarly well known. For example, a micro-strip directional coupler is as shown in U.S. Pat. No. 5,159,298. Further, microwave filters, impedance matching networks, and couplers are well known in the art as shown in *Microwave Filters, Impedance-Matching Networks, and Coupling Structures*. George L. Matthaei, Leo Young, and E. M. T. Jones; McGraw-Hill Book Company, New York; 1964, Library of Congress Catalog Card No. 64-7937.

The Detectors for measuring amplifier RF power, for example, may be coupled to an RF power output line through a microwave coupler as known by those skilled in the art. At microwave frequencies, the coupler may be a micro-strip coupler as shown in the above specified patent. Where the RF power is to be transmitted over a wideband of frequencies, the coupler may exhibit a transfer function varying over that wide frequency band. For example, where the coupler has the characteristics of a bandpass filter, the power out of the coupler at the coupler port may vary, with an increasing power transfer characteristic as frequencies advance in bandpass from the low end with one or more peaks in the center of the bandspread and then decreasing towards the upper end of the bandpass. A matching network may then be used to compensate for that frequency varying transfer function. The purpose of the matching network is to receive the frequency varying output of the coupler and by the additional effect of the matching network's transfer characteristic, produce as substantially a flat power to frequency output response as possible to a detection device such as a detector diode.

However, as the coupler transfer characteristic is non-linear, the power frequency transfer characteristic at the diode detector varies nonlinearly with frequency. This results from the difficulty of matching that nonlinear coupler characteristic. Accordingly, the final signal out such as a voltage in the case of the detector diode, varies from a true signal substantially indicative of the RF amplifier power out over the frequencies in the bandpass.

SUMMARY OF THE INVENTION

As shown in the preferred embodiment, this invention provides a substantially flat detector signal (such as a voltage) in response to RF power over a wideband frequency range. The transfer characteristic for detector voltage to RF power over the frequency bandspread (in the preferred embodiment measured at the output of a power amplifier) is made substantially flat by terminating the coupling port of the RF coupler with a matched impedance and connecting the coupler isolation port to the detector through a compensating linear matching network. With this inventive arrangement, the coupler transfer characteristic varies linearly with respect to frequency within the passband of the coupler. A compensating linear matching network can then be connected to the linearly coupling network to produce a substantially flat RF power output with respect to varying frequency.

The transfer characteristic of the coupler at the isolation part varying linearly with frequency, may have a positive slope over the frequency band spread interest. For a positive slope, more power is coupled to the detector network as frequency is increased. The matching network, may then be designed for a negative slope linear transfer characteristic with respect to increasing frequency. The super-position or addition of the characteristics of the coupler and the matching network then produces substantially flat response at the output of the matching network and to the detector. Accordingly, the power from the matching network into a sensing device such as a detector diode, for example, would then be essentially flat over the RF power frequency bandspread of interest. As a result, the voltage produced by the detector diode would in the preferred embodiment be substantially unaffected by the variations in the RF frequency and would be a substantially accurate representation of RF power out.

In the preferred embodiment, a detector diode is used to produce a voltage indicative of RF power. That diode detector has an internal junction capacitance and a resistance. In the design of the matching network, the junction capacitance is included within this part of the matching network.

What is described is a broadband power detector having an essentially flat response over a bandspread range of interest. The detector employs a coupling device with the output of the coupler isolation port connected to the input of a matching network. The coupler at the coupler port is connected to a matched impedance. The output at the coupler isolation port will vary with frequency but varies substantially linearly. Accordingly, the matching network has a response opposite or inverse to the isolation port output response and compensates for that isolation port response. The result of the output of the matching network is a substantially flat response to the input of the detector.

The output of the detector is then a signal which is substantially flat and indicative of the input to the coupler over the bandspread of interest.

DETAILED DESCRIPTION

Figure 1:
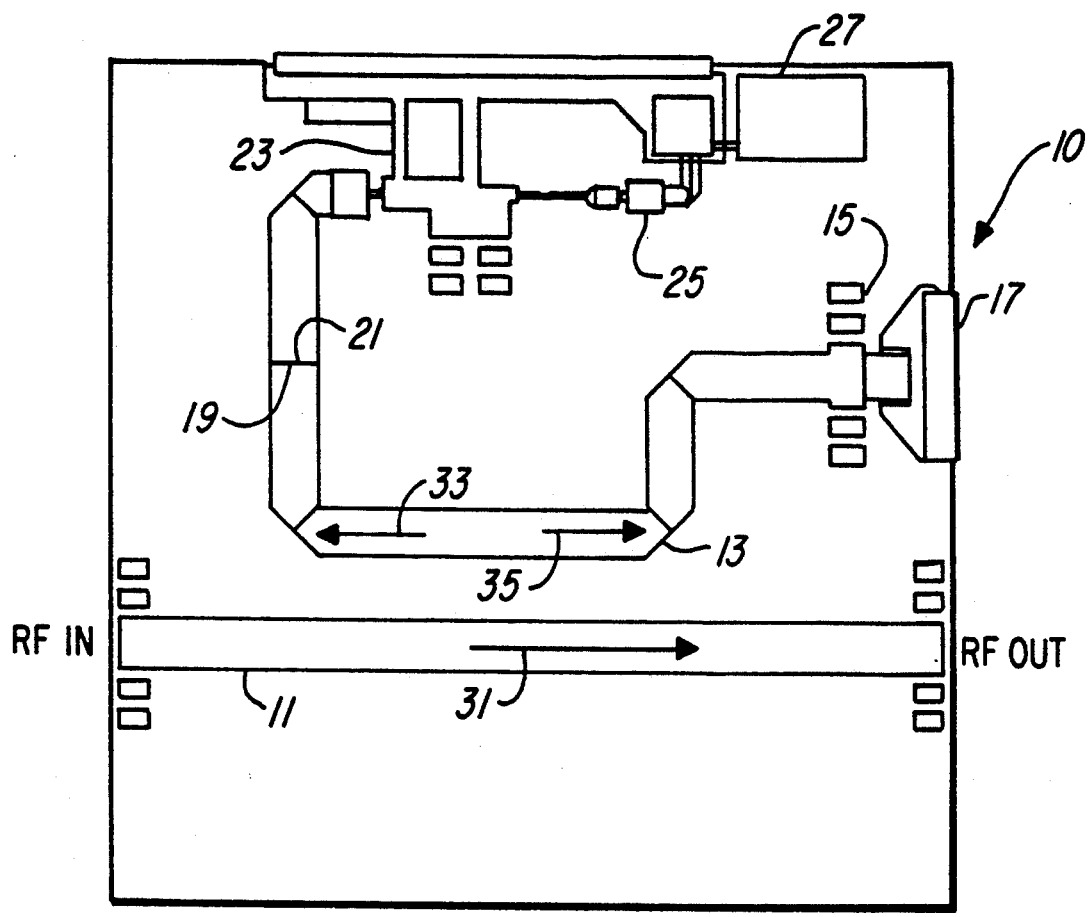
FIG. 1 shows a conventional system for producing a voltage responsive to RF power.

A circuit schematic for a known (prior art) wideband power detector is shown in FIG. 1.

The power detector is shown generally in FIG. 1 by numeral 10. Included is a micro-strip directional coupler having a primary 11 and secondary 13. The isolation port for the secondary of the coupler is shown at 15 connected to a matching impedance 17 as is well known to those skilled in the art. The coupled port 19 is shown connected at input 21 to a matching network shown as 23. A detector diode 25 is shown producing a detector voltage output at 27.

In operation, and as well known to those skilled in the art, the direction of propagation in the primary 11 of the coupler is shown by arrow 31. The primary direction of current propagation in the secondary 13 of the coupler is shown by arrow 33. A secondary direction of current propagation in the secondary 13 of the coupler is shown by arrow 35. As is well known by those skilled in the art, an electromagnetically induced current in the secondary will produce a primary flow 33 in the opposite direction to the primary flow 31 in the coupler primary 11 and a secondary or counterflow 35 in the coupler secondary 13 which flows in the same direction as the of flow of current, in the primary 11, as shown by arrow 35.

Figure 2:
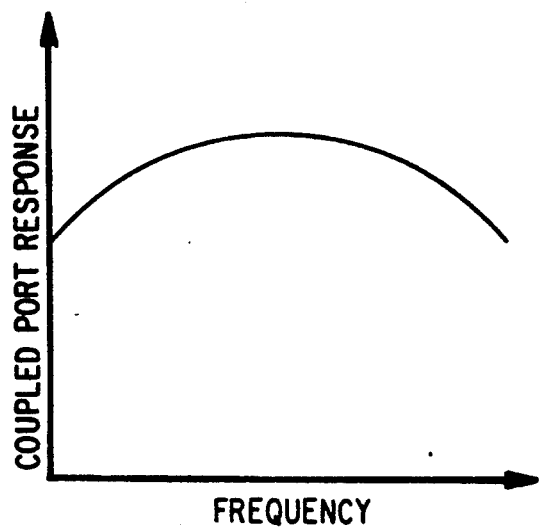
FIG. 2 shows the coupled port response within the coupler of FIG. 1 with respect to frequency.

The coupled port 19 transfer characteristic or response with respect to a varying RF frequency is nonlinear as shown in FIG. 2. It will be understood that this response may be nonlinear as shown or may be nonlinear, having several peaks, depending on the characteristic of the coupling network.

Figure 3:
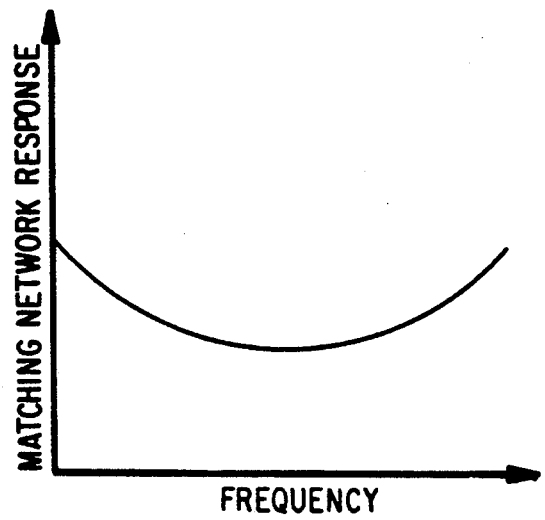
FIG. 3 shows the matching network response with respect to frequency of the matching network shown in FIG. 1.
Figure 4:
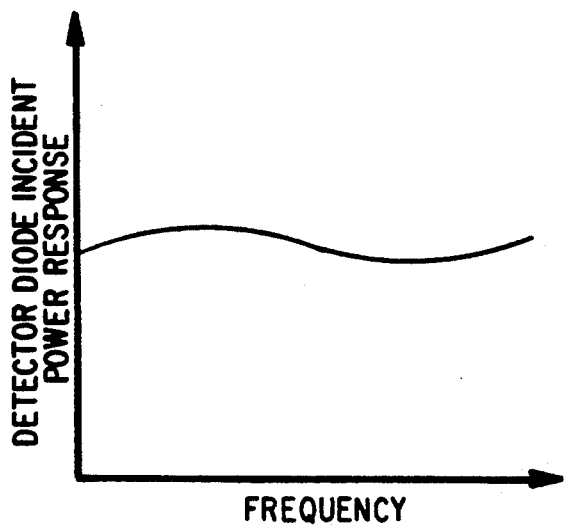
FIG. 4 shows the detector diode incident power response with respect to frequency for the detector shown in FIG. 1.

As known by those skilled in the art, the coupler isolation port 15 would have a matching or terminating resistor 17 and the coupling coefficient can be varied by the physical location or proximity of the secondary 13 with respect to the primary 11. As the desired or preferred response of the detector 25 is flat with respect to RF frequency, it is necessary to design a matching network that compensates for the nonlinearity at the coupling port 19 as shown in FIG. 2. For example, a matching network 23 response compensating the nonlinearity of the coupler may be as shown in FIG. 3. However, attempting to produce a substantially flat detector response starting with the nonlinear coupled port 19 response, at best attainable was a nonlinearly varying response as shown in FIG. 4 by a ripple.

In the preferred embodiment, according to the principles of the invention, shown in FIGS. 5 through 8, a substantially flat detector diode incident power response to frequency is accomplished by reversing the secondary of the coupler and by using the secondary flow of current 35 in the coupler secondary 13 to produce a signal indicative of RF power out.

Figure 5:
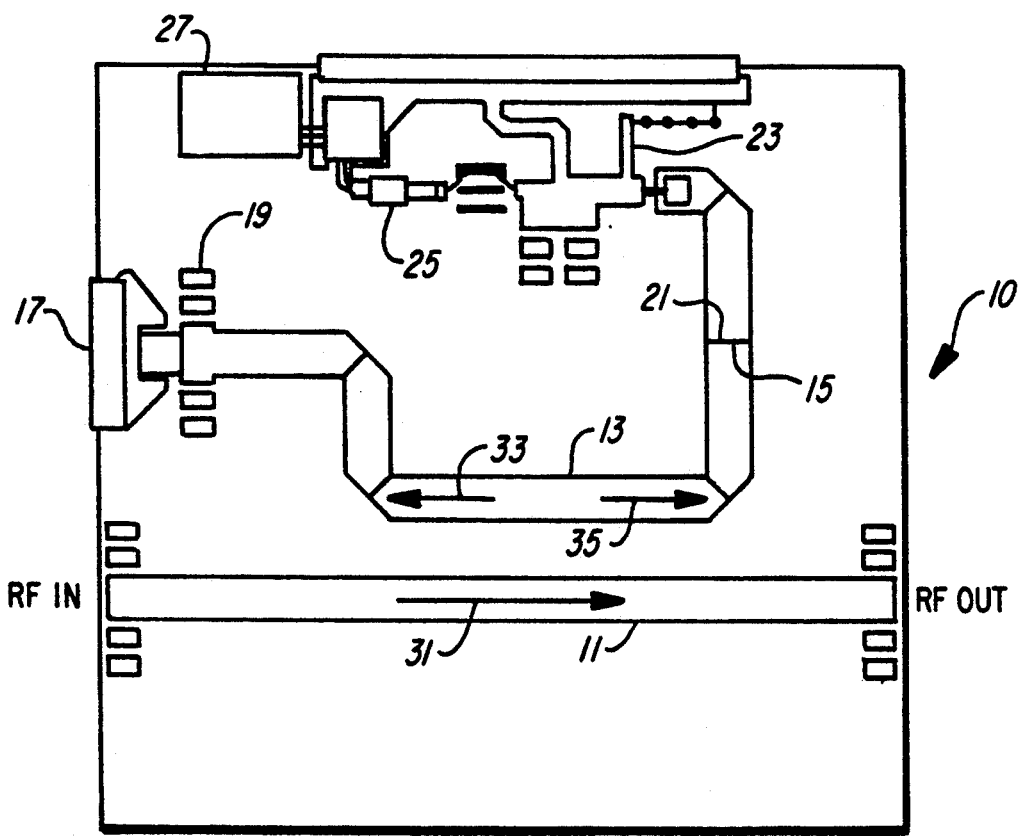
FIG. 5 shows the preferred embodiment of an RF power detector according to the inventive principles.

As shown in FIG. 5, and where the same numerals are used to show the same or similar parts as in FIG. 1, RF current is made to flow within the primary of the coupler 11 as shown by arrow 31 from RF IN to RF OUT. As stated above, a primary current shown by arrow 31 in primary 11 induces secondary current 33 in the secondary 13 of the coupler. A secondary or counterflowing induced current in secondary 13 is shown by arrow 35 flowing opposite to that of the primary induced current 33 as would be well known to those skilled in the art. This secondary current 35 flows in the same direction as the current 31 in primary 11.

The secondary current 35 should be zero or a minimal, under optimum design conditions, as is well known to those skilled in the art, where the load impedance at output of the coupler primary 11 matches the coupler primary output impedance. Under this impedance matching condition, as is well known to those skilled in the art, the current reflected from the coupler primary 11 output port should be zero or minimal. Under the optimum impedance matching condition, described above, the induced current 35 flowing in the coupler secondary 13 towards the isolation port 15 should have no, or minimal, component due to any reflection occurring in the coupler primary 11 due to an impedance mismatch at the primary 11 output port. Where the directional coupler primary output port impedance is terminated in a matching impedance, a secondary current 35 will flow in the coupler secondary 13, in the direction of the secondary isolation port 15. This current is related to the loss in the coupler transmission medium. Increasing or decreasing this coupler loss will affect the level of the signal at the coupler secondary isolation port.

As shown in FIG. 5, the coupled port shown as 19 is connected to terminating resistance 17. The termination or isolation port shown as 15 is coupled to the input 21 of the matching network 23. As would be known to those skilled in the art, the direction of current flow in the coupler secondary 13 defines the coupling and isolation ports. As a result, the counter or secondary induced current 35 flowing in the coupler secondary 13 is transmitted to the matching network 23 and through the matching network 23 to the detector diode 25, producing a detector voltage output 27.

Figure 6:
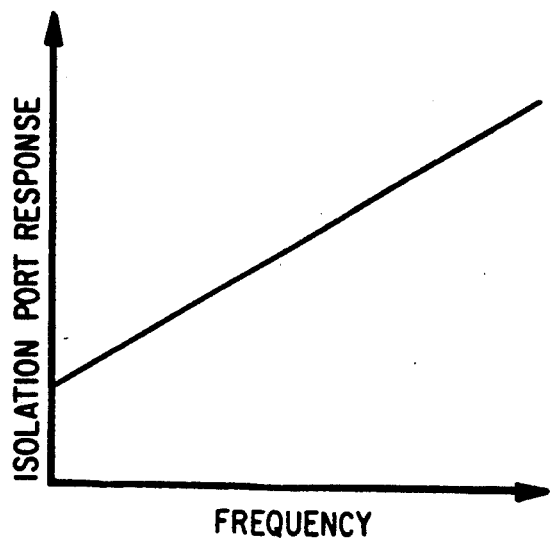
FIG. 6 shows the isolation port response for the coupler shown in FIG. 5 with respect to frequency.
Figure 7:
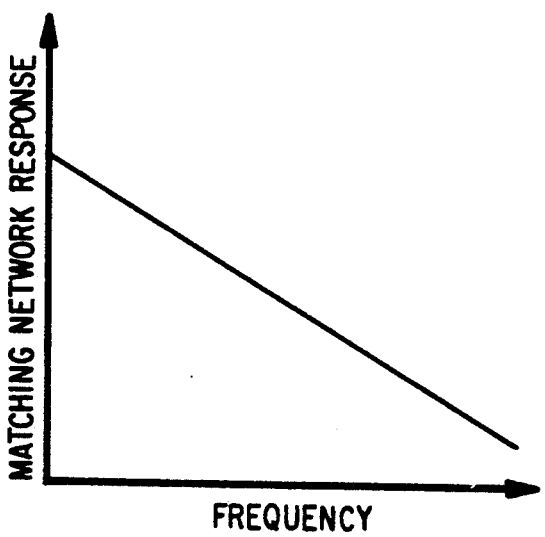
FIG. 7 shows the matching network response for the matching network shown in FIG. 5 with respect to frequency.
Figure 8:
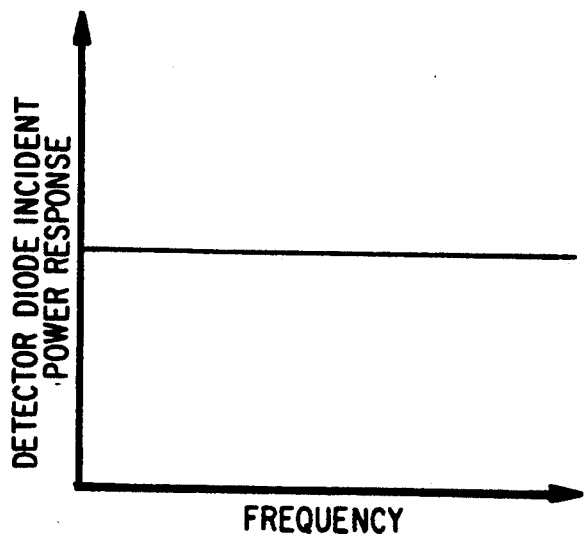
FIG. 8 shows an improved and essentially flat response for the detector diode incident power response with respect to frequency for the detector shown in FIG. 5.

The preferred embodiment, shown in FIG. 5 and, according to the inventive principles, with a matching primary load impedance as described above, the induced current 35 in the coupler secondary 13 produces a substantially linear response at the isolation port 15 with respect to frequency, as shown in FIG. 6. It is easier to compensate a linear varying response as shown in FIG. 6, than the nonlinearly varying response as shown in FIG. 2. According to the inventive principles, and as shown in the preferred embodiment, the matching network 23 response may be designed to have a substantially linear transfer characteristic with respect to increasing frequency. In the preferred embodiment, where the response of the coupler with respect to increasing frequency is shown as substantially linear with a positive slope, the matching network 23 response over the same frequency range would be substantially linear and with a negative slope. The design of such a matching network would be well known to those skilled in the art as shown in *Microwave Filters Impedance-Matching Networks, and Coupling Structures*, as stated above. Accordingly, in the preferred embodiment the output of the coupler at the isolation port increases substantially linearly as the frequency of the RF current through the coupler primary is increased. However, as shown in FIG. 7, the matching network response is made to decrease with respect to increasing frequency. In the preferred embodiment and according to the inventive principles, the addition of the transfer responses of the coupler at its isolation port 15, as shown in FIG. 6, to the response of the matching network 23, as shown in FIG. 7, produces a substantially flat Detector Diode Incident Power Response with respect to frequency, as shown in FIG. 8.

In the preferred embodiment, construction of the matching network 23 incorporates within it the junction capacitance of the detector diode.

What is shown according to the inventive principles is a way of producing a substantially linear transfer responses with respect to frequency so an output signal is substantially flat with respect to a broadband frequency range.

As will be understood by those skilled in the art, the particular design of the coupling network at microwave or other frequencies or of the matching network or the use of a sensor such as a detector diode for detecting incident power is well known to those skilled in the art as shown in the above stated references and is not shown in detail here. Additionally, these features may be varied without departing from the inventive principles shown.

The inventive principles described and claimed in this application should not be thought of as limited to the preferred embodiment shown.

We claim:

1. A broadband power detector coupled to a power source and producing a flat output signal with respect to frequency and indicative of the power of said power source over a finite width frequency band comprising;
   a. a directional coupling means having a primary and secondary circuit and, within said secondary circuit, an isolation port and coupling port; said coupling means coupling said power source to said isolation port;
   b. said primary circuit connected to a load having an impedance matching the output impedance of said primary circuit;
   c. a matching network having an input port and output port; said matching network input port connected to said coupling means isolation port;
   d. said directional coupling means producing an output signal at said isolation port which varies linearly with respect to frequency over said finite frequency band;
   e. said matching network having an input to output port response which compensates for said linear variation of said isolation port output signal with respect to frequency; and
   f. said matching network producing a flat output signal with respect to frequency over said finite frequency band.

2. The power detector of claim 1, wherein; said input to output response of said matching network over said finite width frequency band is the opposite to, or the inverse of, said linearly varying output signal with respect to frequency over said finite frequency band, of said coupling means isolation port.

3. The power detector of claim 1, wherein; said directional coupling means has a matched impedance connected to said directional coupling means coupling port.

4. The power detector of claim 1 including a detector means connected to said matching network output port and said detector produces a signal indicative of power from said power source in response to said matching network output signal at said output port.

5. The power detector of claim 4 wherein said detector is a diode detector; said diode detector has an internal junction capacitance and said matching network includes said junction capacitance.

6. The power detector of claim 1 wherein said power source produces a primary current in said coupling means secondary circuit propagating in a direction toward said coupling port and a secondary current in said coupling means propagating in a direction toward said isolation port.

7. The power detector of claim 1 wherein:
   said output signal at said isolation port increases with respect to increasing frequency and said matching network input to output port response is a decreasing response with respect to increasing frequency.

8. The power detector of claim 7 wherein said matching network response decreases at a rate which is substantially that of the rate of increase of said isolation port output signal with respect to increasing frequency.

9. A method of producing a power indicative signal which is flat with respect to frequency over a finite width frequency band, comprising the steps of:
   a. connecting a primary circuit of a directional coupler to a source of power having frequencies varying over a finite width frequency band;
   b. connecting the output port of said primary circuit to a matched impedance;
   c. connecting the coupling port of a secondary circuit of said directional coupler to a matched impedance and the isolation port of said secondary circuit to a matching network;
   d. producing a signal at said isolation port which varies linearly with respect to the frequency of said power source, over said finite width frequency band;
   e. connecting the signal at the output of said isolation port to said matching network which has a linear transfer characteristic with respect to frequency and which compensates for said linearly varying output at said isolation port; and
   f. producing a flat output signal with respect to frequency over said finite frequency bandwidth, at the output of said matching network.

10. The method of claim 9 including the step of using a matching network having a decreasing slope linear transfer characteristic with respect to increasing frequency where the output at said isolation port increases linearly with increasing frequency.

11. The method of claim 9 including the step of connecting a diode detector to the said output signal at the output of said matching network to produce said power indicative signal.

12. The method of claim 11 including the step of making the junction capacitance of said diode detector part of said matching network.

13. The method of claim 9 including the step of inducing a current flow in the said secondary circuit of said coupler and transmitting the current induced in said secondary circuit of said coupling means to said matching network.

14. A broadband power detector coupled to a power source and producing a flat output signal with respect to frequency and indicative of the power of said power source over a finite width frequency band comprising;
   a. a directional coupling means having a primary and secondary circuit and, within said secondary circuit, an isolation port and coupling port; said coupling means coupling said power source to said isolation port;
   b. said primary circuit connected to a load having an impedance matching the output impedance of said primary circuit;

c. a matching network having an input port and output port; said matching network input port connected to said coupling means isolation port;

d. said directional coupling means producing an output signal at said isolation port which varies linearly with respect to frequency over said finite frequency band;

e. said matching network having an input to output port response which compensates for said linear variation of said isolation port output signal with respect to frequency; and f. said matching network producing an output signal which is flat with respect to frequency over said finite frequency band; and g. said input to output response of said matching network over said finite width frequency band is the opposite to, or the inverse of, said linearly varying output signal with respect to frequency over said finite frequency band, of said coupling means isolation port.

15. The power detector of claim 14, wherein said directional coupling means has a matched impedance connected to said directional coupling means coupling port.

16. The power detector of claim 14 including a detector means connected to said matching network output port and said detector produces a signal indicative of power from said power source in response to said matching network output signal at said output port.

17. The power detector of claim 16 wherein said detector is a diode detector; said diode detector has an internal junction capacitance and said matching network includes said junction capacitance.

18. The power detector of claim 14 wherein said power source produces a primary current in said coupling means secondary circuit propagating in a direction toward said coupling port and a secondary current in said coupling means propagating in a direction toward said isolation port.

19. The power detector of claim 14 wherein:
said output signal at said isolation port increases with respect to increasing frequency and said matching network input to output port response is a decreasing response with respect to increasing frequency.

20. The power detector of claim 19 wherein said matching network response decreases at a rate which is substantially that of the rate of increase of said isolation port output signal with respect to increasing frequency.

21. A method of producing a power indicative signal which is flat with respect to frequency over a finite width frequency band, comprising the steps of:

a. connecting a primary circuit of a directional coupler to a source of power having frequencies varying over a finite width frequency band;

b. connecting the output port of said primary circuit to a matched impedance;

c. connecting the coupling port of a secondary circuit of said directional coupler to a matched impedance and the isolation port of said secondary circuit to a matching network;

d. producing a signal at said coupler isolation port which varies linearly with respect to the frequency of said power source, over said finite width frequency band;

e. connecting the signal at the output of said isolation port to said matching network which has a linear transfer characteristic with respect to frequency and which compensates for said linearly varying output at said isolation port;

f. producing a flat output signal with respect to frequency over said finite frequency bandwidth, at the output of said matching network; and g. including the step of using a matching network having a decreasing slope linear transfer characteristic with respect to increasing frequency where the output at said isolation port increases linearly with increasing frequency.

22. The method of claim 21 including the step of connecting a diode detector to the said output signal at the output of said matching network to produce said power indicative signal.

23. The method of claim 22 including the step of making the junction capacitance of said diode detector part of said matching network.

24. The method of claim 21 including the step of inducing a current flow in the said secondary circuit of said coupler and transmitting the current induced in said secondary circuit to said matching network.

* * * * *